United States Patent
Clark et al.

(10) Patent No.: US 6,487,131 B1
(45) Date of Patent: Nov. 26, 2002

(54) METHOD AND APPARATUS FOR TESTING A CAM ADDRESSED CACHE

(75) Inventors: Lawrence T. Clark, Phoenix, AZ (US); Jay B. Miller, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/475,491

(22) Filed: Dec. 30, 1999

(51) Int. Cl.[7] .................................. G11C 7/00
(52) U.S. Cl. ...................... 365/201; 365/49; 365/230.06
(58) Field of Search .......................... 365/49, 200, 201, 365/230.01, 230.06

(56) References Cited

U.S. PATENT DOCUMENTS

| | | | | |
|---|---|---|---|---|
| 4,680,760 A | * | 7/1987 | Giles et al. ..................... 371/21 |
| 5,563,833 A | * | 10/1996 | Adams et al. ............... 365/201 |
| 5,740,098 A | * | 4/1998 | Adams et al. ................. 365/49 |
| 5,802,070 A | * | 9/1998 | Adams et al. .............. 371/21.1 |
| 5,943,252 A | * | 8/1999 | Schultz et al. ................. 365/49 |
| 6,222,752 B1 | * | 4/2001 | Kumar ......................... 365/49 |

* cited by examiner

Primary Examiner—Viet Q. Nguyen
(74) Attorney, Agent, or Firm—Blakely, Sokoloff, Taylor & Zafman LLP

(57) ABSTRACT

In one embodiment, an array of content addressable memory (CAM) cells include a first plurality of CAM cells and a second plurality of CAM cells. The second plurality of CAM cells has a width sufficient to address a height of the array. A first plurality of CAM drivers are coupled to the array to drive the first plurality of CAM cells. The first plurality of CAM drivers prevent the first plurality of CAM cells from participating in a match when the array is in a test mode.

15 Claims, 6 Drawing Sheets

SET1
SET0

SET1
SET0

METHOD AND APPARATUS FOR TESTING A CAM ADDRESSED CACHE

BACKGROUND

(1). Field of the Invention

The invention relates to testability. More specifically, the invention relates to testability of content addressable memory.

(2). Background

Content addressable memory (CAM) addressed caches have gained increasing popularity for use in microprocessor caches. This popularity increase is primarily due to the elimination of the need for a final decode and that such caches permit high set associativity and low power consumption at the expense of some added chip area. Unfortunately, such CAM addressed caches create testing problems because neither the SRAM portion of the array, nor the CAM locations, are directly addressable. In fact, each CAM cell is formed with several transistors, but the only output is a match line indicating match or no match. A match is determined by whether any cell in the row of the match line drives the match line. Thus, CAM testing necessitates developing a scheme whereby only a single column and row are tested at any one time. It may not be possible to develop an algorithmic scheme for such testing and, in any event, such testing would be prohibitively expensive and time consuming for mass marketed components.

BRIEF SUMMARY OF THE INVENTION

In one embodiment, an array of content addressable memory (CAM) cells includes a first plurality of CAM cells and a second plurality of CAM cells. The first plurality of CAM cells is used as a decoder. The second plurality of CAM cells is algorithmically tested on addresses provided by the first plurality of CAM cells.

DETAILED DESCRIPTION

Figure 1:
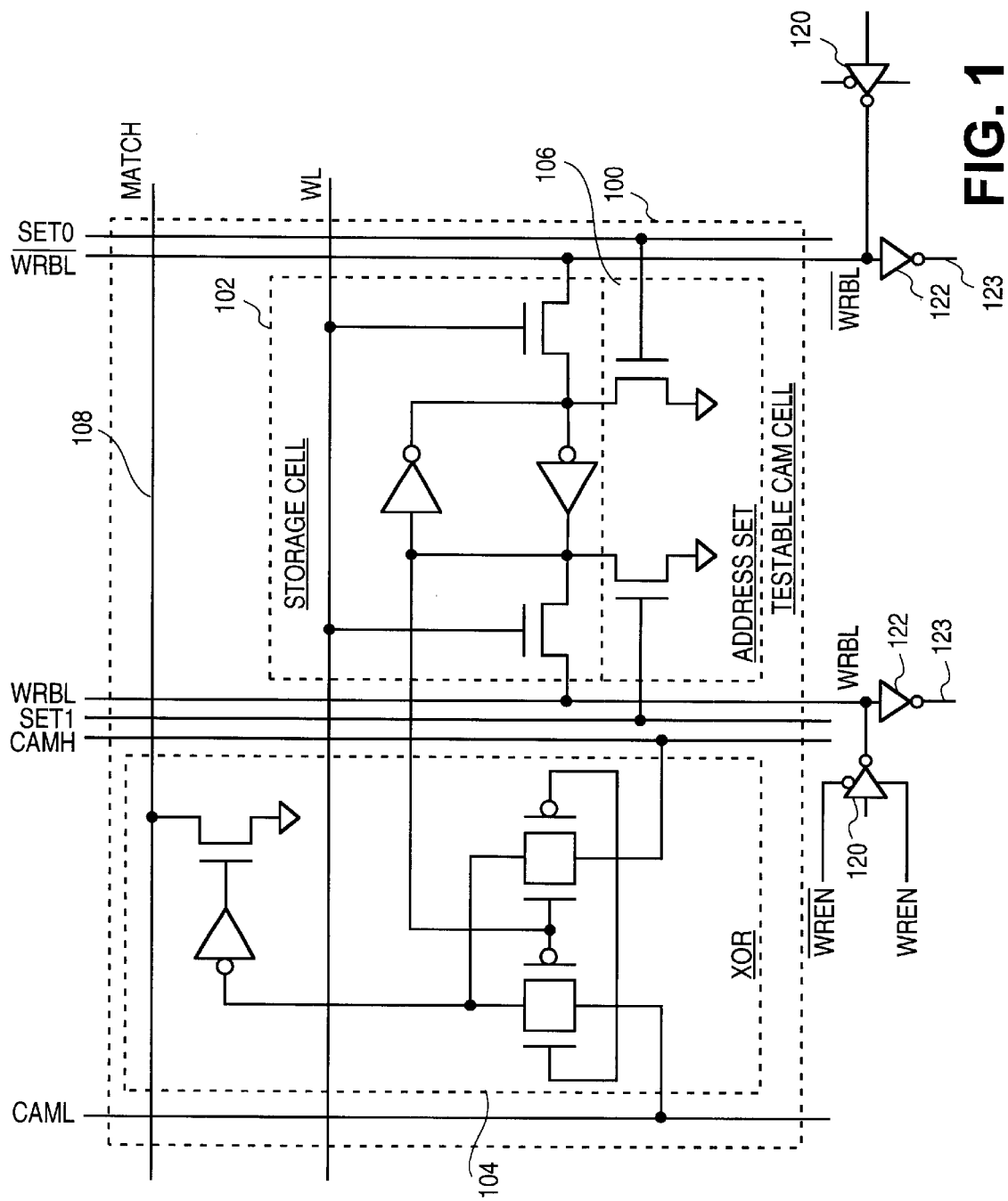
FIG. 1 is a schematic diagram of a CAM cell of one embodiment of the invention.

FIG. 1 is a schematic diagram of a CAM cell of one embodiment of the invention. A plurality of CAM cells makeup a CAM array. CAM cell 100 is an exemplary CAM cell, including an exclusive OR unit (XOR) 104, a storage cell 102, and an address set unit 106. Within a CAM array, each row in the array has a match line, such as match line 108 which is driven by the XOR unit 104 of CAM cell 100 (and all other peripheral cells in the same row).

Traditionally, CAM cells do not permit reading of the cell. However, in one embodiment, a tristateable write buffer 120 is coupled to the write bit line (WRBL), and a second tristatable write driver 120 is coupled to the complement signal line $\overline{\text{WRBL}}$. Also coupled to the WRBL and $\overline{\text{WRBL}}$ signal lines are sense amps 122 which permit the reading of CAM cells. Within a CAM array, these signal lines may be common to all cells in a column. The output of sense amps 122 form a test bus 123 which is not in the signal path during normal operations. The readability of the CAM permits algorithmic testing as further explained below. The SET1 signal line and SET0 signal line permit the CAM cells to be set to one or zero, respectively, during a test mode. The CAM Low (CAML) and CAM High (CAMH) signals control the participation of the particular CAM cell in the match. A cell is deemed to participate in a match when the storage cell 102 dictates whether the cell drives the match line 108.

Figure 2:
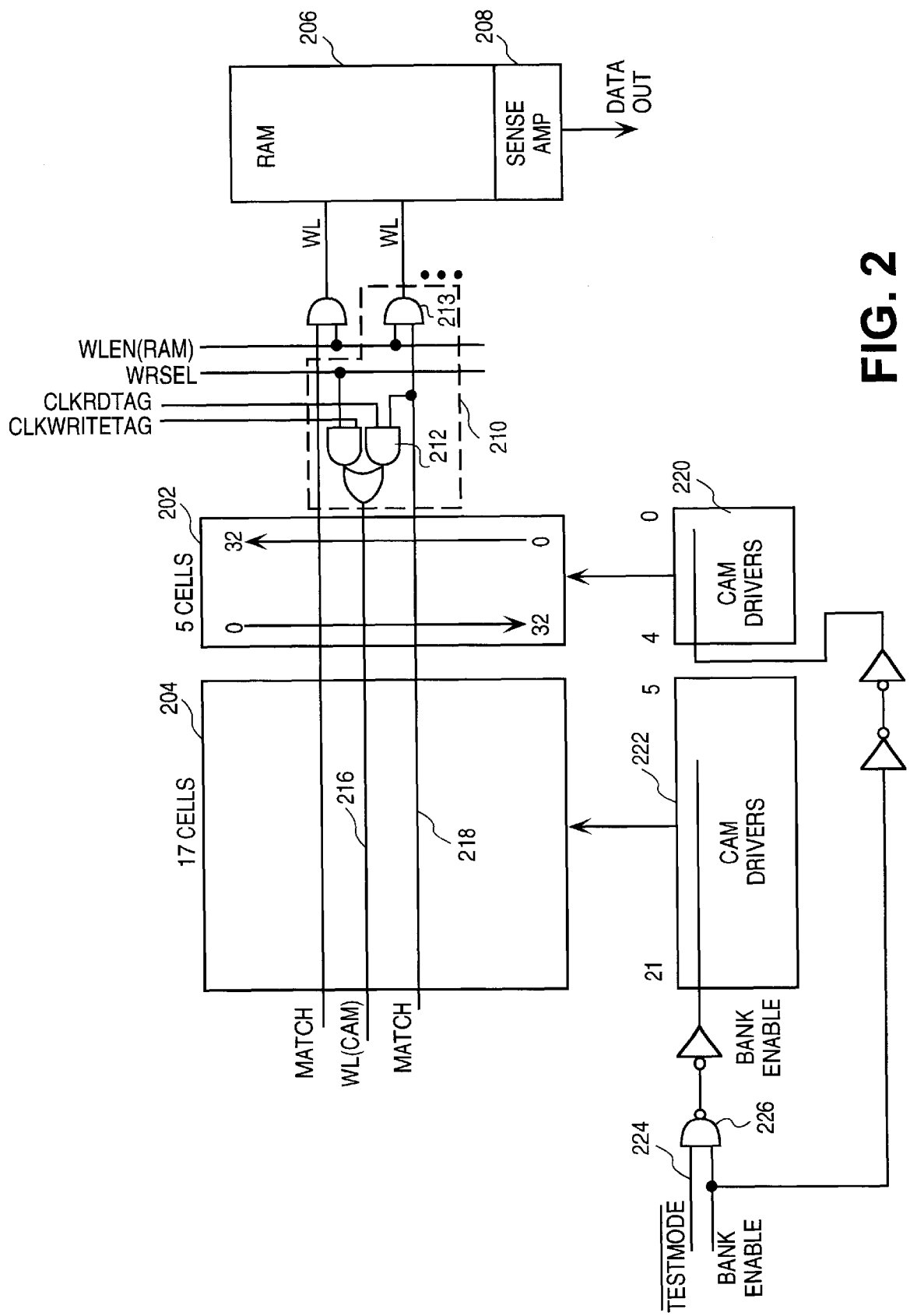
FIG. 2 is a block diagram of a CAM addressed cache of one embodiment of the invention.

FIG. 2 shows a block diagram of a CAM addressed cache of one embodiment of the invention. A CAM array comprises a plurality of CAM cells segregated into two subsets, each subset including a plurality of CAM cells. The segregation is not necessarily physical, but rather relates to match participation during test mode as discussed below. In one embodiment, a first subset of CAM cells 204 are like the CAM cell in FIG. 1 without the address set unit and the SET1 and SET0 signal lines. A second subset of CAM cells 202 are resettable CAM cells such as the CAM cell shown in FIG. 1. In another embodiment, neither subset has address set units or SET1 and SET2 signal lines, such that identical CAM cells are used for both subsets. In yet another embodiment, the second subset of CAM cells does not include sense amps, as the second subset is tested through match participation. In the shown embodiment, the CAM array has a height of 32 lines and has a width of 22 cells. In this embodiment, the second subset is five cells wide because five bits are required to address 32 lines (the height of the array). Thus, the width of the second subset is selected based on the height of the array. A random access memory (RAM) 206 is coupled to (and addressed by) the CAM. The RAM 206 and CAM collectively form the major components of a CAM addressed cache in which the CAM contains tag values and the RAM 206 contains the associated cache line data. A sense amp 208 is coupled to the RAM 20 to permit data to be read out from the RAM 206. A particular RAM line is selected when a word line enable (WLEN) signal and a match of the corresponding line in the CAM are asserted. By controlling the match assertions, the RAM 206 may be algorithmically tested.

When in test mode, the second subset of CAM cells 202 are matched against an incoming address driven via CAM drivers 220. As noted earlier, CAM drivers 222 are disabled so the second plurality of CAM cells does not participate in the match. Thus, CAM cells 202 act as a decoder. Subsequent to the match, one signal, e.g., "match" 218 will stay asserted, while all others will be discharged. The clock read tag signal (CLKRDTAG) may be asserted to read or write the first subset of CAM cells 204. Hence, the CAM cells can be tested algorithmically, e.g., checkerboard and other patterns can be written to and read from the CAM cell array.

Similarly, assertion of the RAM array word-line enable (WLEN) allows similar algorithmic testing of the RAM 206. In one embodiment, WLEN and CLKRDTAG can be asserted simultaneously, allowing simultaneous testing of both the RAM 206 and the CAM cells 204.

A plurality of CAM drivers are provided to drive the CAML and CAMH signals to each column of the CAM array. Enablement for the CAM drivers is controlled such that in a test mode, CAM drivers 222, which drive the cells of the first subset 204, hold the CAML and CAMH signals such that those CAM cells 204 cannot participate in the match, e.g., concurrently holding CAML and CAMH high. Simultaneously, CAM drivers 220 are permitted to drive the CAM cells in the second subset 202, such that only the cells in the second subset 202 are allowed to participate in the match, e.g., by permitting one of the CAML or CAMH lines to be asserted low, as is apparent from the logic of the XOR 104 of FIG. 1.

In this manner, combinational logic 210 for each row in the CAM asserts a CAM word line when the write row select signal (WRSEL) and the clock write tag signal (CLKWRITETAG) are asserted (this typically occurs during cache fill in normal operation), or if the match line and CLKRDTAG are asserted for that CAM row. Both CAM reads and writes occur based on the CLKRDTAG signal when the CAM is in test mode. The assertion of the word line signal 216 permits that row to be read out through the sense amps as previously described in relation to FIG. 1 or written by the write drivers in the same figure. The ability to control the addresses in the second subset of CAM cells 202 and assert the word line based on a match dependent only on those CAM cells 202, permits the algorithmic testing of the first subset of CAM cells 204. In one embodiment, the CAM drivers 222 for the first subset of CAM cells 204 is disabled by NANDing an active low test mode signal with a bank enable signal and using an inverted result to drive the CAM drivers 222. Meanwhile, the bank enable signal may drive through buffers to drive the CAM drivers 220 to permit them to operate in a normal match mode during test.

Figure 3:
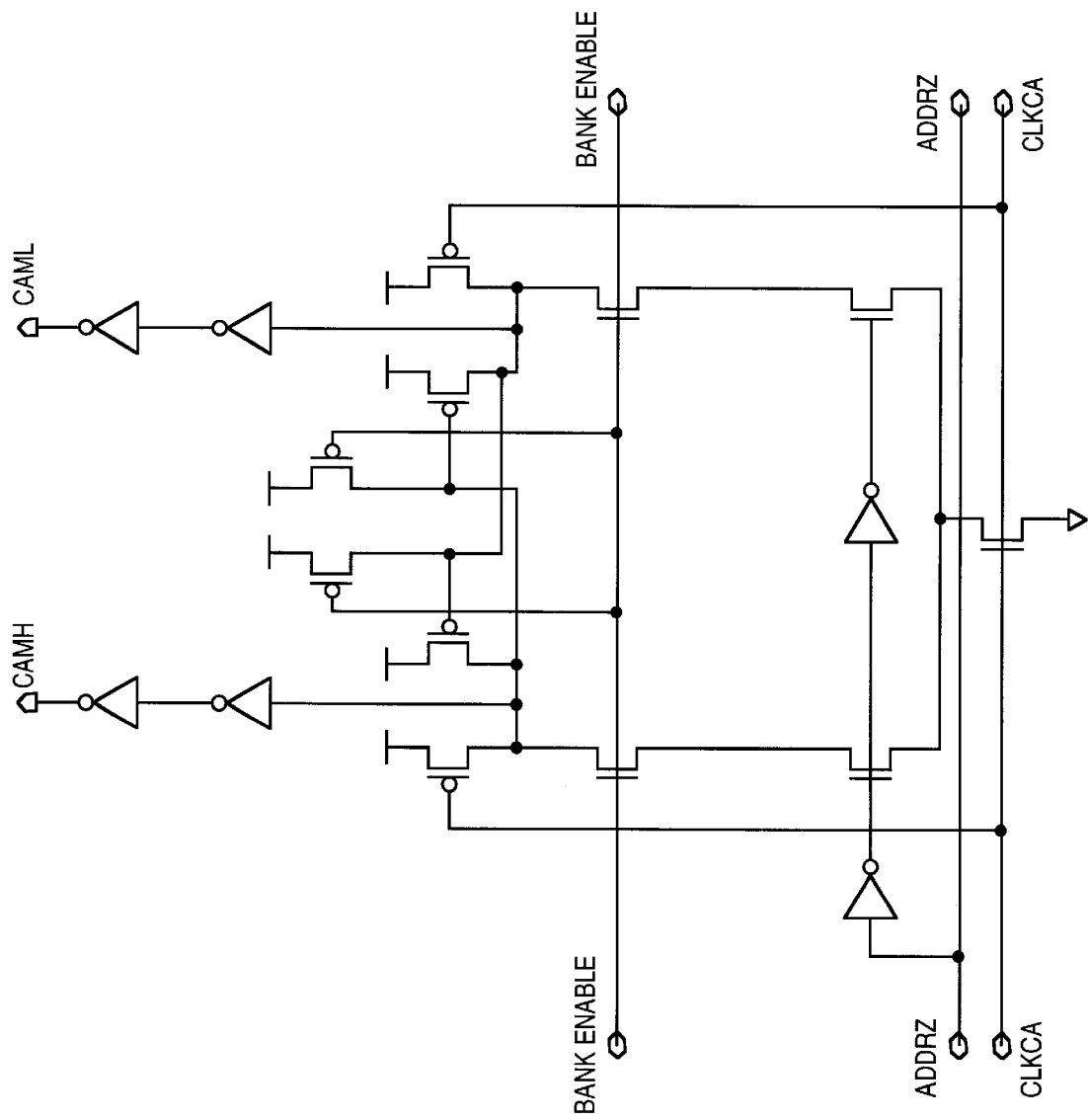
FIG. 3 is a schematic of an exemplary CAM driver which may be used as one of the CAM drivers in FIG. 2.

Thus, in test mode, the first subset of CAM cells 204 operates in read and write modes. The second subset of CAM cells 202 operates in a match mode during test. Both subsets 202 and 204 operate in match mode in the course of normal operations. FIG. 3 shows a schematic of an exemplary CAM driver which may be used as one of the CAM drivers in FIG. 2. In test mode, by holding both CAMH and CAML high, the cells driven by the particular CAM driver are prevented from participating in the match.

Figure 4A:
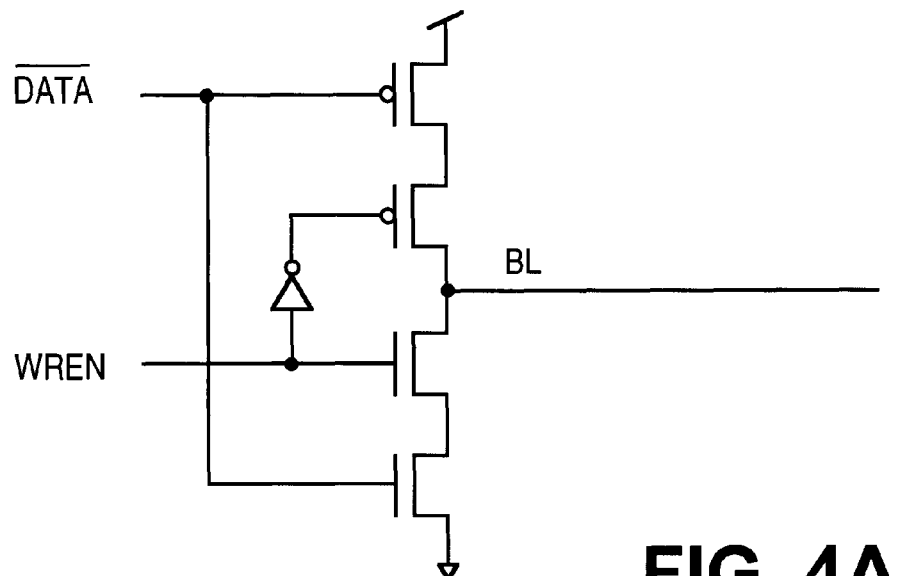
FIG. 4A is a schematic diagram of a write driver of one embodiment of the invention.
Figure 4B:
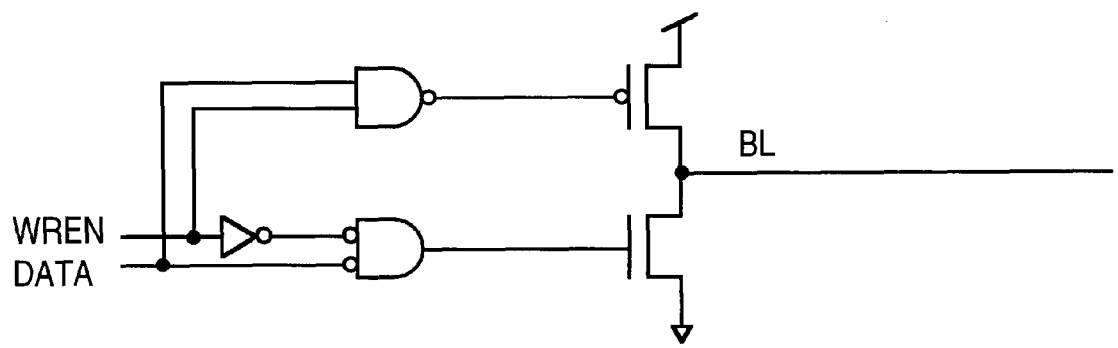
FIG. 4B is a schematic diagram of a write driver of an alternate embodiment of the invention.

FIGS. 4A and 4B are alternative write drivers of one embodiment of the invention. Both these drivers are tristatable to permit sense amp reads of the bit lines when the write drivers are not driving a signal.

Figure 5:
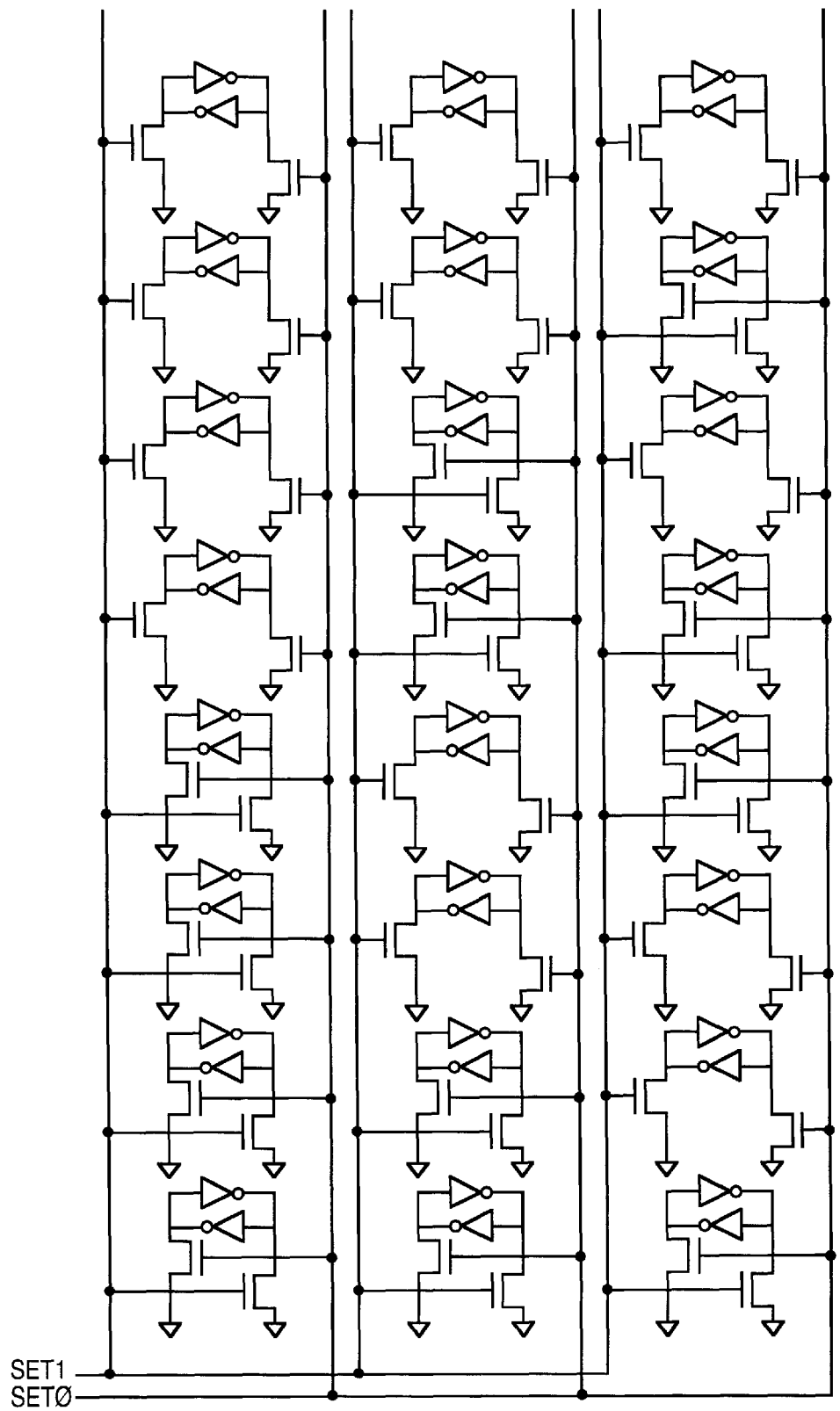
FIG. 5 is a simplified schematic diagram of columns of settable CAM cells which may be used in one embodiment of the invention.

FIG. 5 is a simplified schematic diagram of columns of settable CAM cells which may be used in one embodiment of the invention. In this simplified diagram, only the inverters of the storage cell and the address set unit are shown. By appropriately coupling the SET1 and SET0 signal lines to the address set unit transistor gates, a desired addressing pattern may be driven into the storage cell of the CAM cells. In this example as coupled, assertion of SET1 will cause the pattern (from top to bottom in the figure) of 111; 110; 101; 100; 011; 010; 001; and 000. Asserting SET0 sets the storage cells of the array to a complementary address pattern of (again from top to bottom in the figure) 000; 001; 010; 011; 100; 101; 110; and 111. In this manner, the settable cells are tested by their participation in the match and the settable cells act as a decoder for the remainder of the array. In this example, the array has a height of eight rows. Thus, only three columns are required for addressing. However, more or fewer columns may be used dependent on the number of addresses needed to address the array.

Figure 6:
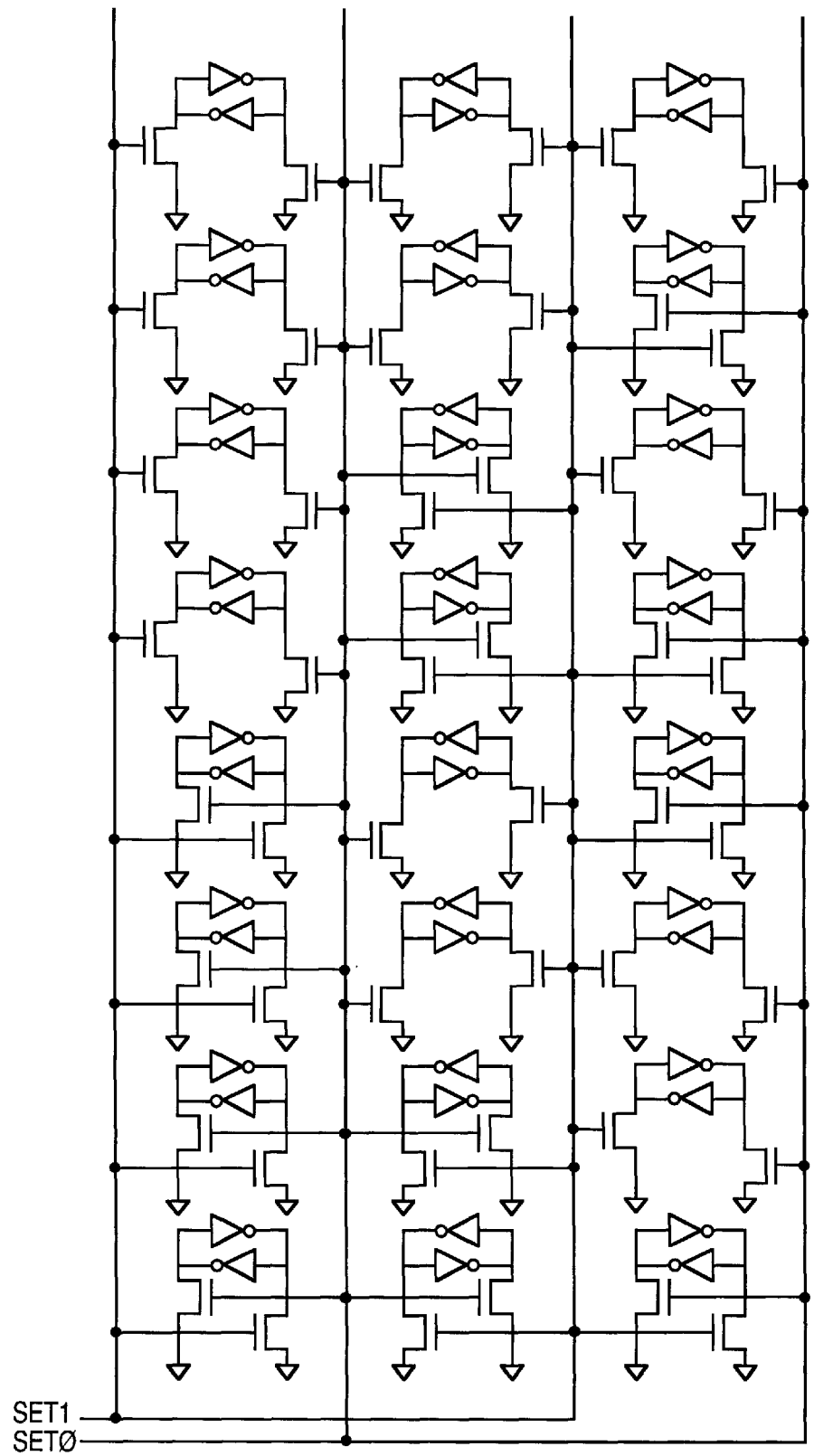
FIG. 6 is a simplified schematic diagram of columns of settable CAM cells which may be used in an alternative embodiment of the invention.

FIG. 6 is a simplified schematic diagram of columns of settable CAM cells which may be used in an alternative embodiment of the invention. The embodiment shown in FIG. 6 is slightly more space efficient than the embodiment of FIG. 5. In this embodiment, by flipping the polarity of every other column, the number of vertical routes for the set signals is reduced. Specifically, the number of vertical routes is limited to N+1, rather than 2N, where N is the number of columns. This minimizes the size impact of providing the SET signals.

As mentioned above, in an alternative embodiment of the invention, the set signals and address set unit of each CAM cell is omitted. In such an embodiment, at test time, the addresses are simply written in row by row in an ordered series, e.g., 0–32 and then 32–0. This would require 32 write accesses of the CAM array for the initial series and an additional 32 accesses for the complementary series, but since test is a generally a very small part of a component's life, the real estate savings of eliminating the address set unit and the various set vertical routes may justify bearing the additional time cost of accessing the CAM array during test.

In the foregoing specification, the invention has been described with reference to specific embodiments thereof. It will, however, be evident that various modifications and changes can be made thereto without departing from the broader spirit and scope of the invention as set forth in the appended claims. The specification and drawings are, accordingly, to be regarded in an illustrative rather than a restrictive sense.

What is claimed is:

1. An apparatus comprising:
   an array of content addressable memory (CAM) cells, including a first plurality of CAM cells and a second plurality of CAM cells, the second plurality having a width sufficient to address a height of the array; and
   a first plurality of CAM drivers are coupled to the array for driving the first plurality of CAM cells, wherein the first plurality of drivers prevent the first plurality of CAM cells from participating in a match in a test mode.

2. The apparatus of claim 1 further comprising:
   a second plurality of drivers for driving the second plurality of CAM cells, wherein the second plurality of drivers permits the second plurality of CAM cells to participate in the match.

3. The apparatus of claim 1 further comprising:
   a plurality of sense amps coupled to bit lines of the first plurality and second plurality of CAM cells.

4. The apparatus of claim 1 further comprising:
   a plurality of tristatable write drivers coupled to the word bit lines of the first and the second plurality of CAM cells.

5. The apparatus of claim 1 wherein each CAM cell of the second plurality comprises:
   an exclusive OR (XOR) unit;
   a storage cell coupled to the XOR unit; and
   an address set unit coupled to the storage cell.

6. The apparatus of claim 5 wherein the address set unit comprises:
   a first transistor coupled to a first node of the storage cell such that turning the first transistor on will set the storage cell to a high value; and
   a second transistor coupled to a second node of the storage cell such that turning the second transistor on will set the storage cell to a low value.

7. The apparatus of claim 3 wherein each sense amp of the plurality has an output, the outputs of the plurality of sense amps collectively comprising a test bus that is external to all signaling paths used when the array is not under test.

8. A method comprising:
  disabling a first plurality of content addressable memory (CAM) cells of a CAM array from participating in a match;
  driving a second plurality of CAM cells of the CAM array to participate in the match, the second plurality having a width sufficient to address a height of the CAM array.

9. The method of claim 8 further comprising:
  writing a series of addresses into the second plurality of CAM cells.

10. The method of claim 9 further comprising:
  reading the first plurality of CAM cells after the series of addresses is written.

11. The method of claim 9 further comprising:
  writing a complement of the series of addresses into the second plurality of CAM cells.

12. The method of claim 11 further comprising:
  reading the first plurality of CAM cells after the inverse of addresses is written.

13. A computer readable storage media containing executable computer program instructions which when executed cause a digital processing system to perform a method comprising:
  driving a content addressable memory (CAM) array into a test mode;
  disabling a first plurality of CAM drivers for the CAM array;
  enabling a second plurality of CAM drivers for the CAM array such that only CAM cells driven by the second plurality of CAM drivers can participate in a match.

14. The computer readable storage media of claim 13 which when executed cause a digital processing system to perform a method further comprising:
  loading a plurality of CAM cells driven by the second plurality of CAM drivers with an ordered series of addresses.

15. The computer readable storage media of claim 14 which when executed cause a digital processing system to perform a method further comprising:
  loading the plurality of CAM cells with a complement of the ordered series of addresses.

* * * * *